United States Patent
Kashiwaya et al.

(10) Patent No.: US 6,748,959 B1
(45) Date of Patent: Jun. 15, 2004

(54) CARBON LAYER FORMING METHOD

(75) Inventors: Makoto Kashiwaya, Kanagawa (JP); Junji Nakada, Kanagawa (JP)

(73) Assignee: Fuji Photo Film., Ltd., Kanagawa (JP)

( * ) Notice: Subject to any disclaimer, the term of this patent is extended or adjusted under 35 U.S.C. 154(b) by 0 days.

(21) Appl. No.: 09/534,207

(22) Filed: Mar. 24, 2000

(30) Foreign Application Priority Data

Mar. 26, 1999 (JP) ............................................ 11-083913

(51) Int. Cl.$^7$ .............................. C25F 5/00; H01L 21/31
(52) U.S. Cl. ........................ 134/1.1; 438/780; 438/781
(58) Field of Search ................................ 438/780, 781; 427/249.3, 70, 122, 131, 577, 578; 428/408, 694 TC, 65.3, 65.5

(56) References Cited

U.S. PATENT DOCUMENTS

| | | | | |
|---|---|---|---|---|
| 4,816,113 A | * | 3/1989 | Yamazaki ................... | 156/643 |
| 5,637,393 A | * | 6/1997 | Ueda et al. ................. | 428/332 |
| 5,712,000 A | * | 1/1998 | Wei et al. ................... | 427/573 |
| 5,925,494 A | * | 7/1999 | Horn ....................... | 430/270.1 |
| 6,026,762 A | * | 2/2000 | Kao et al. ................. | 315/111.21 |
| 6,090,456 A | * | 7/2000 | Wu et al. ................... | 427/577 |
| 6,186,153 B1 | * | 2/2001 | Kitsunai et al. ............ | 134/1.1 |
| 6,443,165 B1 | * | 9/2002 | Akahori et al. ............. | 134/1.1 |

FOREIGN PATENT DOCUMENTS

| | | | |
|---|---|---|---|
| JP | 58-42472 | 3/1983 | .............. B41J/3/20 |
| JP | 63-78761 | 4/1988 | .............. B41J/3/20 |
| JP | 7-132628 | 5/1995 | ............ B41J/2/335 |

OTHER PUBLICATIONS

Patent Abstract of Japan 0713628 May 23, 1995.
Patent Abstract of Japan 63078761A Apr. 8, 1988.
Patent Abstract of Japan 58042472A Mar. 11, 1983.

* cited by examiner

Primary Examiner—Nadine G. Norton
Assistant Examiner—Duy-Vu Deo
(74) Attorney, Agent, or Firm—Sughrue Mion, PLLC

(57) ABSTRACT

The carbon layer forming method starts a film deposition process of a carbon layer by vapor phase deposition after a content of particles having a particle size of 0.5 μm or more is adjusted in a film deposition system of the carbon layer to 1000 particles/ft$^3$/min or less. The carbon layer forming method by means of a vapor phase deposition technique such as sputtering or CVD ensures that a high-quality carbon layer having significantly reduced pinholes or cracks can be obtained. Since the carbon protective layer obtained by this method has no cracking and delamination due to pinholes and cracks, the thermal head having the carbon protective layer has a sufficient durability to ensure that high reliability is exhibited over an extended period of time to perform thermal recording of high-quality images consistently over an extended period of operation.

17 Claims, 1 Drawing Sheet

CARBON LAYER FORMING METHOD

BACKGROUND OF THE INVENTION

This invention relates to the technical field of carbon layer forming methods using a vapor phase deposition technique such as sputtering or chemical vapor deposition (CVD). More specifically, this invention relates to a carbon layer forming method particularly used with advantage in forming a carbon protective layer in a protective coating of a thermal head performing thermal recording.

Thermal materials comprising a thermal recording layer on a substrate of a film or the like are used to record images produced in diagnosis by ultrasonic scanning (sonography).

This recording method, also referred to as thermal recording, eliminates the need for wet processing and offers several advantages including convenience in handling. Hence, in recent years, the use of the thermal recording system is not limited to small-scale applications such as diagnosis by ultrasonic scanning and an extension to those areas of medical diagnoses such as CT, MRI and X-ray photography where large and high-quality images are required is under review.

As is well known, thermal recording involves the use of a thermal head having a glaze, in which heating elements comprising a heat-generating resistor and electrodes, used for heating a thermal material to record an image are arranged in one direction (main scanning direction) and, with the glaze urged at small pressure against the thermal material, the two members are moved relative to each other in an auxiliary scanning direction perpendicular to the main scanning direction, and energy is applied to the heating elements of the respective pixels in the glaze in accordance with image data to be recorded which were supplied from an image data supply source such as MRI or CT in order to heat the thermal recording layer of the thermal material, thereby performing image recording through color formation.

A protective coating is formed on the surface of the glaze of the thermal head in order to protect the heat-generating resistor for heating a thermal material, the associated electrodes and the like. Therefore, it is this protective coating that contacts the thermal material during thermal recording and the heat-generating resistor heats the thermal material through this protective coating so as to perform thermal recording.

The protective coating is usually made of wear-resistant ceramics; however, during thermal recording, the surface of the protective coating is heated and kept in sliding contact with the thermal material, so it will gradually wear and deteriorate upon repeated recording.

If the wear of the protective coating progresses, density unevenness will occur on the thermal image or a desired protective strength can not be maintained and, hence, the ability of the protective coating to protect the heat-generating resistor is impaired to such an extent that the intended image recording is no longer possible (the head has lost its function).

Particularly in the applications such as the aforementioned medical use which require multiple gradation images of high quality, the trend is toward ensuring the desired high image quality by adopting thermal films with highly rigid substrates such as polyester films and also increasing the setting values of recording temperature (energy applied) and of the pressure at which the thermal head is urged against the thermal material. Under these circumstances, as compared with the conventional thermal recording, a greater force and more heat are exerted on the protective coating of the thermal head, making wear and corrosion (or wear due to corrosion) more likely to progress.

With a view to preventing the wear of the protective coating on the thermal head and improving its durability, a number of techniques to improve the performance of the protective coating have been considered. Among others, a carbon-based protective coating (hereinafter referred to as a carbon protective layer) is known as a protective coating excellent in resistance to wear and corrosion.

Thus, Examined Published Japanese Patent Applications (KOKOKU) No. 61-53955 and No. 4-62866 (the latter being the divisional application of the former) disclose a thermal head excellent in wear resistance and response which is obtained by forming a very thin carbon protective layer having a Vickers hardness of 4500 $kg/mm^2$ or more as the protective coating of the thermal head and a method of manufacturing the thermal head, respectively.

Unexamined Published Japanese Patent Application (KOKAI) No. 7-132628 discloses a thermal head which has a dual protective coating comprising a lower silicon-based compound layer and an overlying diamond-like carbon layer, said protective coating having wear and breakage significantly reduced, thereby ensuring that high-quality images can be recorded over an extended period of time.

The carbon protective layer (carbon layer) has properties quite similar to those of diamond including a very high hardness and chemical stability, hence the carbon protective layer presents sufficiently excellent properties to prevent wear and corrosion which may be caused by the sliding contact with thermal materials.

The carbon protective layer is excellent in wear resistance, but brittle because of its hardness, that is, low in tenacity.

Therefore, if the carbon protective layer has pinholes, cracks and the like, a thermal shock or stress due to heating of heating elements, a stress due to a difference in the coefficient of thermal expansion between the carbon protective layer and the neighboring layer, a mechanical impact due to a foreign matter entered between the thermal material and the thermal head (glaze) or other factors may bring about rather easily cracking or delamination.

If cracking or delamination is caused in the protective coating, wear, corrosion and also wear due to corrosion progress, leading to the deterioration of the durability of the thermal head. The thermal head is not capable of exhibiting high reliability over an extended period of time.

SUMMARY OF THE INVENTION

An object of the present invention is to solve the prior art problems by providing a carbon-based layer forming method by means of a vapor phase deposition technique such as sputtering or CVD, said method ensuring that a high-quality carbon layer having significantly reduced pinholes or cracks can be obtained.

By using the present invention, for example, to fabricate a thermal head having a carbon-based protective layer, the carbon protective layer obtained has no cracking and delamination due to pinholes and cracks, and can provide the thermal head having a sufficient durability to ensure that high reliability is exhibited over an extended period of time to perform thermal recording of high-quality images consistently over an extended period of operation.

In order to achieve the above object, the invention provides a method of forming a carbon layer by vapor phase deposition, comprising the steps of adjusting a content of particles having a particle size of 0.5 μm or more in a film deposition system of the carbon layer to 1000 particles/ft$^3$/min or less, and then starting a film deposition process of the carbon layer.

Preferably, the content of the particles having the particle size of 0.5 μm or more is reduced to 500 particles/ft$^3$/min.

Preferably, the carbon layer is formed as a protective coating on a thermal head performing thermal recording.

Preferably, a lower limit of the content of the particles having the particle size of 0.5 μm or more ranges between 50 particles/ft$^3$/min and 100 particles/ft$^3$/min.

DETAILED DESCRIPTION OF THE INVENTION

The carbon layer forming method of the invention will now be described in detail with reference to the preferred embodiments shown in the accompanying drawings.

The following description is directed to a case where the method of the invention is applied to the formation of a protective coating on a thermal head. The invention is not however limited to this case, and can be used in forming a carbon layer in various intended uses including various products and members as exemplified by magnetic heads, molds for plastics and tools.

Figure 1:
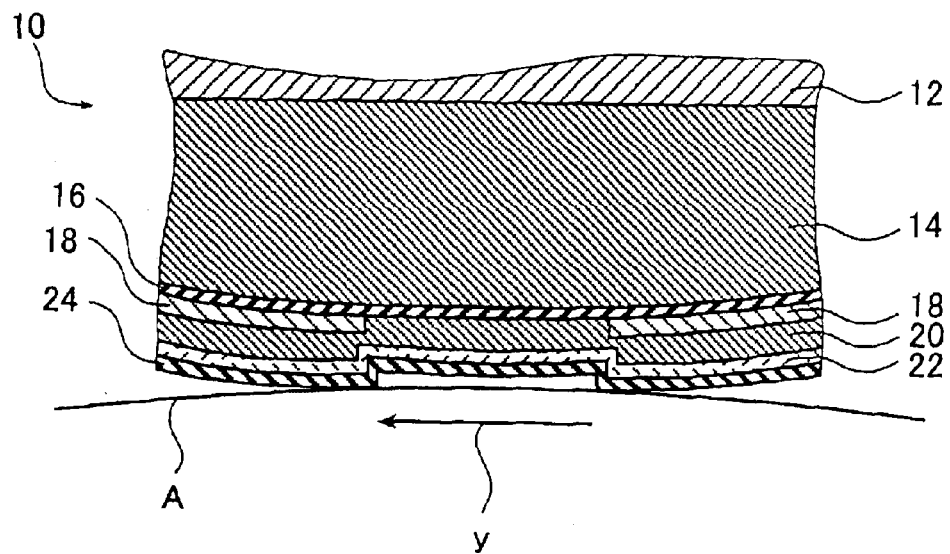
FIG. 1 is a schematic cross sectional view showing the structure of a heating element in a thermal head fabricated using the present invention.

FIG. 1 shows a schematic cross sectional view of a heating element of a thermal head in which the carbon layer forming method of the invention is used to form a carbon protective layer.

The thermal head 10 shown in FIG. 1 is capable of image recording on thermal sheets of up to, for example, B4 size at a recording (pixel) density of, say, about 300 dpi. Except for the protective coating, the head has a known structure in that heating elements performing thermal recording on a thermal material A are arranged in one direction, that is, in a main scanning direction (which is normal to the plane in FIG. 1).

As shown in FIG. 1, the thermal head 10 comprises a glaze layer (heat-accumulating layer) 14 formed on the top of a substrate 12 (which is shown to face down in FIG. 1 since the thermal head 10 is pressed downward against the thermal material A), a heater (heat-generating resistor) 16 formed on the glaze layer 14, electrodes 18 formed on the heater 16, and a protective coating formed to protect the heating elements comprising the heater 16 and the electrodes 18.

The protective coating in the illustrated thermal head 10 is composed of three layers: a lower protective layer 20 superposed on the heater 16 and the electrodes 18, an intermediate protective layer (hereinafter referred to as an intermediate layer) 22 formed on the lower protective layer 20 and a carbon-based protective layer (hereinafter referred to as a carbon protective layer) 24 which is formed on the intermediate layer 22.

The illustrated thermal head 10 has essentially the same structure as known versions of thermal head except for the characteristic film deposition of the carbon protective layer 24. Therefore, the layer arrangement and the constituent materials of the respective layers are well known. Specifically, the substrate 12 may be formed of various electrical insulating materials including heat-resistant glass and ceramics such as alumina, silica and magnesia; the glaze layer 14 may be formed of heat-resistant glass, heat resistant resins including polyimide resin and the like; the heater 16 may be formed of heat-generating resistors such as Nichrome (Ni—Cr), tantalum metal and tantalum nitride; and the electrodes 18 may be formed of electrically conductive materials such as aluminum, gold, silver and copper.

Heating elements are known to be available usually in two types, one being of a thin-film type which is formed by a "thin-film" process such as vacuum deposition, chemical vapor deposition (CVD) or sputtering and a photoetching technique, and the other being of a thick-film type which is formed by a "thick-film" process comprising the steps of printing (e.g., screen printing) and firing. The thermal head 10 for use in the invention may be formed by either method.

The lower protective layer 20 may be formed of various materials as long as they have insulating properties and sufficient heat resistance, corrosion resistance and wear resistance to serve as the protective layer of the thermal head. Various ceramic materials are preferably used.

Specific materials include silicon nitride ($Si_3N_4$), silicon carbide (SiC), tantalum oxide ($Ta_2O_5$), aluminum oxide ($Al_2O_3$), SIALON (Si—Al—O—N), LASION (La—Si—O—N), silicon oxide ($SiO_2$), aluminum nitride (AlN), boron nitride(BN), selenium oxide (SeO), titanium nitride (TiN), titanium carbide (TiC), titanium carbide nitride (TiCN), chromium nitride (CrN) and mixtures thereof. Among these, nitrides and carbides are preferably used in such aspects as easy film deposition, manufacturing cost, and resistance to mechanical wear and chemical wear. Silicon nitride, silicon carbide and SIALON are more preferably used. Additives such as metals may be incorporated in small amounts into the lower protective layer 20 to adjust physical properties thereof.

Methods of forming the lower protective layer 20 are not limited in any particular way and known methods of forming ceramic films (layers) such as sputtering, especially magnetron sputtering, and CVD, especially plasma-assisted CVD may be employed by applying the aforementioned thick-film and thin-film processes and the like. Among these, CVD is preferably employed.

As is well known, CVD is a technique of film deposition in which thermal or optical energy is applied to gaseous materials in a reaction chamber to induce various chemical reactions, thereby depositing substances on the substrate. The lower protective layer 20 which is very fine and has no defects such as cracks can be formed by means of CVD, whereupon a thermal head more excellent in durability and advantageous in image quality can be obtained.

The illustrated thermal head 10 has a protective coating of three-layer structure, in which the lower protective layer 20 as described above is coated with the intermediate layer 22 which is, in turn, coated with the carbon protective layer 24.

As described above, a thermal head having a prolonged service life can be obtained by forming the carbon protective layer 24 on the lower protective layer 20. If the intermediate layer 22 is further inserted therebetween, the adhesion of the lower protective layer 20 to the carbon protective layer 24 and the shock absorption can be improved, thereby providing a thermal, head with prolonged service life and which is more excellent in durability and long term reliability.

The intermediate layer 22 is preferably based on at least one component selected from the group consisting of metals in Group IVA (titanium group), Group VA (vanadium group) and Group VIA (chromium group) of the periodic table, as well as silicon (Si) and germanium (Ge) in such aspects as the adhesion to the upper carbon protective layer 24 and the lower protective layer 20 and the durability of the carbon protective layer 24.

Preferred specific examples include Si, Ge, titanium (Ti), tantalum (Ta), molybdenum (Mo) and mixtures thereof. Among these, Si and Mo are more preferably used in the binding with carbon and other aspects. Most preferably, Si is used.

Methods of forming the intermediate layer 22 are not limited in any particular way and any known film deposition methods may be used in accordance with the material of the intermediate layer 22 by applying the aforementioned thick-film and thin-film processes and the like. A preferred method includes sputtering, but plasma-assisted CVD is also available with advantage.

In the illustrated thermal head 10, the carbon-based protective layer 24 is formed on the intermediate layer 22.

It should be noted that the carbon-based protective layer 24 as used in the present invention refers to a carbon layer containing not less than 50 atm % of carbon, and preferably comprising carbon and inevitable impurities. In the thermal head 10 of the invention, suitable components to be incorporated in addition to carbon to form the carbon protective layer 24 include hydrogen, nitrogen, fluorine, Si and Ti. In the case of hydrogen, nitrogen and fluorine, the content thereof in the carbon protective layer 24 is preferably less than 50 atm %, and in the case of Si and Ti, the content thereof in the carbon protective layer 24 is preferably not more than 20 atm %.

Methods of forming the carbon protective layer 24 are not limited in any particular way and any known vapor phase deposition methods may be used in accordance with the composition of the carbon protective layer 24 to be formed. Preferred methods include sputtering, especially magnetron sputtering, and CVD, especially plasma-assisted CVD.

The carbon layer forming method of the invention uses the vapor phase deposition technique to form a carbon-based carbon layer (carbon protective layer 24 in the illustrated case). The film deposition process is started after the content of particles having a particle size of 0.5 $\mu$m or more (hereinafter referred to as 0.5 $\mu$m-particle content) in the film deposition system is adjusted to 1000 particles/ft$^3$/min (cubic feet per minute ="cfm") or less, preferably 500 particles/cfm or less.

By starting the film deposition process after the dust content in the film deposition system is adjusted to 1000 particles/cfm in terms of the 0.5 $\mu$m-particle content, a high-quality carbon layer having significantly reduced pinholes or cracks can be formed. If the present invention is used for example to form the carbon protective layer 24 on the thermal head 10 as shown in FIG. 1, the carbon protective layer 24 has no cracking or delamination due to pinholes or cracks and can provide the thermal head 10 that exhibits high reliability over an extended period of time.

The present invention has no particular limitations on the lower limit of the 0.5 $\mu$m-particle content in the film deposition system, but lower values are more preferred. The lower limit of the 0.5 $\mu$m-particle content ranges preferably about between 50 particles/cfm and 100 particles/cfm taking into consideration economics, labor and utility.

The method of adjusting the 0.5 $\mu$m-particle content in the film deposition system used to form the carbon layer to 1000 particles/cfm or less is not limited in any particular way. An illustrative method is to remove dust particles adhered to the chamber wall or other components in the film deposition system by cleaning the interior of the chamber in the film deposition system with a cloth that produces not more than 3000 particles/cfm, especially not more than 1000 particles/cfm, more especially not more than 300 particles/cfm of dust before the carbon layer forming process is started. Further, the film deposition system is more preferably pumped out after the cleaning to remove dust floating therein.

The operation for removing the particles can be performed prior to or just before the formation of the carbon layer. When fabricating the illustrated thermal head 10 for example, the removal operation may be performed prior to forming the intermediate layer 22 or the lower protective layer 20.

It should be noted that, when the operation for removing the particles precedes the formation of the intermediate layer 22 or the lower protective layer 20, formation of the intermediate layer 22 and the carbon protective layer 24 or from the lower protective layer 20 to the carbon protective layer 24 is preferably performed continuously in vacuo without releasing to the air.

The carbon protective layer 24 may be formed while heating to about 50° C.–400° C., especially to a temperature at which the thermal head 10 is used. In this method, the adhesion of the carbon protective layer 24 to the intermediate layer 22 and the lower protective layer 20 can be further improved, and more excellent durability can be imparted to the carbon protective layer 24 which is protected from cracking and delamination caused by a thermal shock and a mechanical impact due to a foreign matter entered during thermal recording, as well as alteration and attrition of the carbon protective layer 24 due to high power recording. It should be however noted that heating can be performed by a method using a heating device such as a heater, or a method of energizing the thermal head 10.

The hardness of the carbon protective layer 24 is not limited to any particular value as far as the carbon protective layer 24 has a sufficient hardness to serve as the protective coating of the thermal head. Thus, the carbon protective layer 24 having a Vickers hardness of about from 3000 kg/mm$^2$ to 5000 kg/mm$^2$ is advantageously illustrated. The hardness may be constant or varied in the thickness direction of the carbon protective layer 24. In the latter case, the hardness variation may be continuous or stepwise.

The respective layers in the illustrated thermal head 10 are not limited in thickness to any particular values. However, the lower protective layer 20 has preferably a thickness of from 0.2 $\mu$m to 20 $\mu$m, particularly from 2 $\mu$m to 15 m, the intermediate layer 22 has preferably a thickness of from 0.05 m to 1 $\mu$m, particularly from 0.1 $\mu$m to 1 $\mu$m, and the carbon protective layer 24 has preferably a thickness of from 0.5 $\mu$m to 5 $\mu$m, particularly from 1 $\mu$m to 3 $\mu$m. If the thicknesses of the intermediate layer 22 and the carbon protective layer 24 are within the stated ranges, the adhesion of the intermediate layer 22 to the lower protective layer 20 and the shock absorption thereof as well as the functions of the carbon protective layer 24 including durability can be consistently realized in a well balanced manner.

Also in the case of two-layered structure not including the intermediate layer 22, the thicknesses are not limited to any particular values. However, the lower protective layer 20 has preferably a thickness of from 0.5 $\mu$m to 50 $\mu$m, particularly from 2 $\mu$m to 20 $\mu$m, and the carbon protective layer 24 has preferably a thickness of from 0.1 $\mu$m to 5 $\mu$m, particularly from 1 $\mu$m to 3 $\mu$m, in such an aspect that wear resistance and heat conductivity (namely recording sensitivity) can be balanced with advantage.

Figure 2:
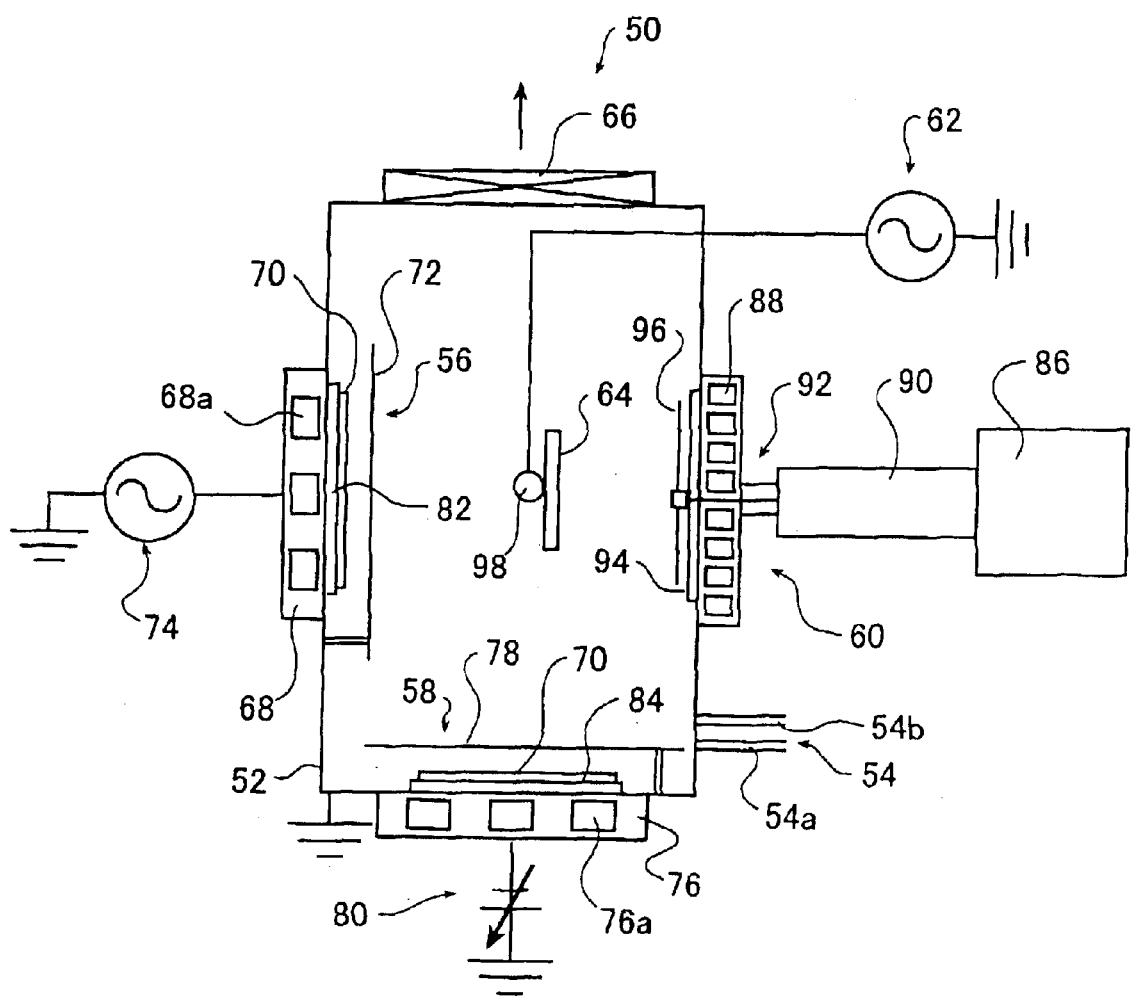
FIG. 2 shows the concept of an exemplary film deposition apparatus for implementing the present invention.

FIG. 2 shows the concept of an exemplary film deposition apparatus that is suitable for forming the protective coating on the thermal head as shown in FIG. 1 and in which the method of the invention is implemented.

The illustrated film deposition apparatus generally indicated by 50 in FIG. 2 comprises a vacuum chamber 52, a gas introducing section 54, a first sputter device 56, a second sputter device 58, a plasma generating device 60, a bias source 62 and a substrate holder 64 as the basic components.

The film deposition apparatus 50 comprises three film deposition devices located in the system or the vacuum chamber 52, the two being performed by sputtering and the other by plasma-assisted CVD. A plurality of layers that are different in the composition can be formed continuously.

Therefore, the film deposition apparatus 50 can be used to form the lower protective layer 20, the intermediate layer 22 and the carbon protective layer 24 with a high efficiency by means of sputtering using different targets or the combination of sputtering with plasma-assisted CVD.

The vacuum chamber 52 is preferably formed of a non-magnetic material such as SUS 304. A vacuum pump-down device 66 is provided to evacuate the interior of the film deposition system to reduce the pressure. Those sites of the vacuum chamber 52 where plasma develops or an arc is produced by plasma generating electromagnetic waves may be covered with an insulating member, which may be made of insulating materials including MC nylon, Teflon (PTFE) or the like.

The gas introducing section 54 consists of two parts 54a and 54b, the former being a site for introducing a plasma generating gas and the latter for introducing a reactive gas for use in the plasma-assisted CVD, into the vacuum chamber 52.

Inert gases such as argon, helium and neon are used as the plasma generating gas.

Examples of the reactive gas for producing the carbon protective layer 24 are the gases of hydrocarbon compounds such as methane, ethane, propane, ethylene, acetylene and benzene. Examples of the reactive gas for producing the intermediate layer 22 are various gases including materials used to form the intermediate layer 22.

Further, examples of the reactive gas for producing the lower protective layer 20 are various gases including materials used to form the lower protective layer 20. Specifically, a mixed gas of silane, nitrogen and oxygen or the like can be used as the reactive gas when producing a silicon nitride layer as the lower protective layer 20.

To effect sputtering, a target 70 to be sputtered is placed on each of cathodes 68 and 76, which are rendered at negative potential and a plasma is generated on the surface of the target 70, whereby atoms are struck out of the target 70 and deposit on the surface on the opposed substrate to form the coating.

The first sputter device 56 and the second sputter device 58 are both intended for sputtering film deposition on the surface of the substrate. The former comprises the cathode 68, the area where the target 70 is to be placed, a shutter 72, a radio-frequency (RF) power supply 74 and other components. The latter comprises the cathode 76, the area where the target 70 is to be placed, a shutter 78, a direct current (DC) power supply 80 and other components.

As seen from the above configuration, the first sputter device 56 and the second sputter device 58 have basically a similar configuration except that the power supply and the positions of the respective components are different. Therefore, we now describe the first sputter device 56 as a typical example except for the different portions.

In order to generate plasma on the surface of the target 70 in the second sputter device 58, the negative side of the DC power supply 80 is directly connected to the cathode 76, and sputtering voltage is applied.

The output and performance of the two power supplies are not limited in any particular way, and a device having the necessary and sufficient performance to produce a layer of interest can be selected. In case of an apparatus used to form the carbon protective layer 24 for example, a DC power supply can be used which is at negative potential capable of producing a maximal output of 10 kW, and which is adapted to be capable of pulse modulation at frequencies in the range of 2 to 100 kHz by means of a modulator.

In the illustrated case, a backing plate 82 (or 84 in the second sputter device 58) made of oxygen-free copper, stainless steel or the like is first fixed to the cathode 68 and the target 70 is then attached to the backing plate 82 with In-based solder or by a mechanical fixing device.

Preferred materials of the target 70 used to form the lower protective layer 20 include various ceramic materials such as $Si_3N_4$ and SIALON as described above. Preferred materials of the target 70 used to form the intermediate layer 22 include metals of the Groups IVA, VA and VIA and monocrystalline Ge and Si and the like. The target 70 used to form the carbon protective layer 24 is preferably made of sintered carbon, glassy carbon or the like.

The illustrated apparatus performs magnetron sputtering, in which magnets 68a (or 76a) are placed within the cathode 68 and a sputtering plasma is confined within a magnetic field formed on the surface of the target 70. Magnetron sputtering is preferred since it achieves high deposition rates.

The illustrated film deposition apparatus 50 is used to form the carbon protective layer 24 by means of the plasma-assisted CVD with microwave ECR discharge which generate plasma with microwave in the ECR magnetic filed. The plasma generating device 60 comprises a microwave source 86, magnets 88, a microwave guide 90, a coaxial transformer 92, a dielectric plate 94 and a radial antenna 96 and the like.

A source having the necessary and sufficient output to produce the carbon protective layer 24 can appropriately be selected as the microwave source 86. Permanent magnets or electromagnets capable of forming a desired magnetic field can be appropriately used as the magnets 88 for generating the ECR magnetic field. The microwave is introduced into the vacuum chamber 52 by means of the microwave guide 90, the coaxial transformer 92, the dielectric plate 94 and the like.

The substrate holder 64 is used to fix the portion to be coated in the thermal head 10 (or the substrate) in position. The film deposition apparatus 50 as shown in FIG. 2 comprises these three film deposition devices. The substrate holder 64 is held on a rotary base 98 which rotates to move the substrate holder 64 so that the glaze on the substrate holder 64 can be opposed to the respective film deposition devices, that is, the sputter devices 56 and 58, and the plasma generating device 60 by means of the plasma-assisted CVD.

The distance between the substrate holder 64 and the target 70 or the radial antenna 96 can be adjusted by a known method and a distance that provides a uniform thickness profile may be set appropriately.

The surface of the lower protective layer 20 or the intermediate layer 22 is roughened as required by etching to improve the adhesion. In addition, film deposition is preferably performed with a negative bias voltage being applied to the substrate in order to obtain a hard coating by the plasma-assisted CVD.

To do this, the bias source 62 that applies a radio-frequency voltage to the substrate is connected to the substrate holder 64 in the film deposition apparatus 50. A radio-frequency self-bias voltage is preferably used in the plasma-assisted CVD.

On the foregoing pages, the carbon layer forming method of the invention has been described in detail but the present invention is in no way limited to the stated embodiments and various improvements and modifications can, of course, be made without departing from the spirit and scope of the invention.

As described above in detail, the present invention is capable of forming a high-quality carbon layer having significantly reduced pinholes or cracks. By using the method of the invention, for example, to form the carbon protective layer 24 on the illustrated thermal head 10, the carbon protective layer 24 obtained has no cracking or delamination and can provide the thermal head 10 that exhibits high reliability over an extended period of time.

The invention will be further illustrated by means of the following specific example.

EXAMPLE 1

As in known methods of fabricating a thermal head, the heat-accumulating layer 14 was formed on the substrate 12, and the heater 16 and the electrodes 18 were formed on the layer 14 by sputtering, and a pattern was formed by photolithography and etching. A thermal head having no protective coating was thus fabricated.

According to the procedure described below, a silicon nitride ($Si_3N_4$) layer having a thickness of 7 μm was formed as the lower protective layer 20 on the thermal head obtained.

Formation of Lower Protective Layer 20

A conventional sputter device was used to perform film deposition by magnetron sputtering with an RF power of from 2 to 5 kW.

A SiN sintering agent was used as the target.

As for the gases to be introduced into the chamber for sputtering, 100 sccm of argon was used as the carrier gas, and 20 sccm of nitrogen gas and 5 sccm of oxygen gas were used as the reactive gas. The total gas pressure (the internal pressure of the chamber) was adjusted to 5 mTorr.

To control the thickness of the silicon nitride layer, the deposition rate was determined previously and the time required to reach a specified layer thickness was calculated.

The film deposition apparatus 50 described below and shown in FIG. 2 was used to form the intermediate layer 22 and the carbon protective layer 24 on the lower protective layer 20 of the thermal head.

Film Deposition Apparatus 50 a. Vacuum Chamber 52

The vacuum chamber 52 made of SUS 304 and having a capacity of 0.5 m³ was used; the vacuum pump-down device 66 comprised one unit each of a rotary pump having a pumping speed of 1,500 L/min, a mechanical booster pump having a pumping speed of 12,000 L/min and a turbomolecular pump having a pumping speed of 3,000 L/sec. An orifice valve was fitted at the suction inlet of the turbomolecular pump to allow for 10 to 100% adjustment of the degree of opening.

b. Gas Introducing Section 54

A mass flow controller permitting a maximum flow rate of 50 to 500 sccm and a stainless steel pipe having a diameter of 6 mm were used to form two gas introducing parts 54a and 54b, the former being used for introducing a plasma generating gas and the latter being used for introducing a reactive gas.

c. First and Second Sputter Devices 56, 58

The cathodes 68 and 76 used were in a rectangular form having a width of 600 mm and a height of 200 mm, with Sm—Co magnets being incorporated as the permanent magnets 68a and 76a. The backing plates 82 and 84 were rectangular oxygen-free copper members, which were attached to the cathodes 68 and 76 with In-based solder. The interior of the cathodes 68 and 76 was water-cooled to cool the magnets 68a and 76a, the cathodes 68 and 76 and the rear side of each of the backing plates 82 and 84.

The RF power supply 74 used had a frequency of 13.56 MHz and could produce a maximal output of 10 kW. The DC power supply 80 used was at negative potential capable of producing a maximal output of 10 kW. The DC power supply 80 was adapted to be capable of pulse modulation at frequencies in the range of 2 to 100 kHz in combination with the modulator.

d. Plasma Generating Device 60

The microwave source 86 oscillating at a frequency of 2.45 GHz and producing a maximal output of 1.5 kW was employed. The generated microwave was guided to the neighborhood of the vacuum chamber 52 by means of the microwave guide 90, converted in the coaxial transformer 92 and directed to the radial antenna 96 in the vacuum chamber 52. The plasma generating part used was in a rectangular form having a width of 600 mm and a height of 200 mm.

A magnetic field for ECR was produced by arranging a plurality of Sm—Co magnets used as the magnets 88 in a pattern to conform to the shape of the dielectric plate 94.

e. Substrate Holder 64

The rotary base 98 was rotated to move the substrate holder 64 so that the substrate (the thermal head 10) fixed thereon is kept opposed to one of the targets 70 in the first and second sputter devices 56 and 58 and the radial antenna 96 in the plasma generating device 60. The distance between the substrate and each target 70 was set at 100 mm when forming the intermediate layer 22 and the carbon protective layer 24 by sputtering as described below.

In addition, the area of the substrate holder 64 in which the thermal head was held was set at a floating potential in order to enable the application of an etching radio-frequency voltage. A heater was also provided on the surface of the substrate holder 64 for film deposition with heating.

f. Bias Source 62

An RF power supply was connected to the substrate holder 64 via the matching box.

The RF power supply had a frequency of 13.56 MHz and could produce a maximal output of 3 kW. It was also adapted to be such that by monitoring the self-bias voltage, the RF output could be adjusted over the range of −100 to −500 V.

In this apparatus 50, the bias source 62 also serves as the etching device.

Formation of InterMediate Layer and Carbon Protective Layer 24

In the film deposition apparatus 50, the thermal head 10 was secured to the substrate holder 64 such that the heating elements (lower protective layer 20) would be kept opposed to the target 70 positioned in the first sputter device 56. All areas of the thermal head other than those where the intermediate layer 22 was to be formed were previously masked.

Prior to starting the film deposition process, a cloth that produces 300 particles/cfm of dust was used to clean the inner wall surfaces of the vacuum chamber 52 to thereby remove dust particles adhered thereto. Then, dust particles floating in the vacuum chamber 52 were aspirated and ejected using a vacuum cleaner.

Subsequently, the 0.5 μm-particle content in the vacuum chamber 52 was measured with a laser particle counter (Model 237B from Met One Co., Ltd.). The value obtained was 500 particles/cfm.

With continued pump-down by the vacuum pump-down device 66, argon gas was introduced through the gas introducing section 54 and the pressure in the vacuum chamber 52 was adjusted to $5.0 \times 10^{-3}$ Torr by means of the orifice valve fitted on the turbomolecular pump. Subsequently, a radio-frequency voltage was applied to the substrate and the lower protective layer 20 (silicon nitride layer) was etched for 10 minutes at a self-bias voltage of −300 V.

After the end of etching, a monocrystalline silicon target and a sintered graphite member were fixed (i.e., attached by means of In-based solder) on the backing plate 82 in the first sputter device 56 and on the backing plate 84 in the second sputter device 58, respectively. Then, the vacuum chamber 52 was evacuated again until the internal pressure reached $5.0 \times 10^{-6}$ Torr. The argon gas flow rate and the orifice valve were adjusted so as to maintain the internal pressure in the vacuum chamber 52 at $5.0 \times 10^{-3}$ Torr, and a RF power of 0.5 kW was applied to the target 70 for five minutes, with the shutter 72 being closed.

Subsequently, with the internal pressure in the vacuum chamber 52 kept at the stated level, the RF power was raised to 2 kW and the shutter 72 was opened. The sputtering was performed to form a silicon layer having a thickness of 0.2 μm as the intermediate layer 22. To control the thickness of the silicon layer, the deposition rate was determined previously and the time required to reach a specified layer thickness was calculated.

Then, the rotary base 98 was rotated to oppose the heating elements to the target 70 (i.e. the sintered graphite member) in the second sputter device 58. The argon gas flow rate and the orifice valve were adjusted so as to maintain the internal pressure in the vacuum chamber 52 at $2.5 \times 10^{-3}$ Torr, and a DC power of 0.5 kW was applied to the target 70 for 5 minutes with the shutter 78 being closed.

Subsequently, with the internal pressure in the vacuum chamber 52 kept at the stated level, the DC power was raised to 5 kW and the shutter 78 was opened. The sputtering was performed to form the carbon protective layer 24 having a thickness of 2 μm. The thermal head 10 which has a three-layered protective coating comprising the lower protective layer 20, the intermediate layer 22 and the carbon protective layer 24 was thus obtained.

To control the thickness of the carbon protective layer 24 being formed, the deposition rate was determined previously and the time required to reach a specified layer thickness was calculated.

Evaluation of Performance

The surface of the carbon protective layer 24 of the thermal head obtained was observed with an optical microscope. The size of every defect confirmed was not more than 10 μm.

The thermal head 10 was used to record a solid image on a thermal recording material. Any damage including delamination of the carbon protective layer 24 was not confirmed even after 25,000 sheets were recorded.

COMPARATIVE EXAMPLE 1

Example 1 was repeated except that a cloth producing 5000 particles/cfm or less of dust was used to clean the inner wall surfaces of the vacuum chamber 52 before forming the carbon protective layer 24, or dust was aspirated by a vacuum cleaner without cleaning them with a cloth. Thus, two samples of the thermal head 10 having a three-layered protective coating composed of the lower protective layer 20, the intermediate layer 22 and the carbon protective layer 24 were fabricated.

The 0.5 μm-particle content in the vacuum chamber 52 after the dust particles were ejected with the vacuum cleaner was measured as in Example 1. The values obtained were 5000 particles/cfm in the case that used the cloth producing 3000 particles/cfm of dust, and 8000 particles/cfm in the case that performed only particle ejection with the vacuum cleaner.

The carbon protective layer 24 of the obtained samples of the thermal head 10 was observed with an optical microscope. As a result, defects having a size of up to about 100 μm were confirmed.

A solid image was recorded on a thermal recording material as in Example 1. As a result, at the end of recording 5,000 sheets, delamination of the carbon protective layer 4 was confirmed in the defects having a size of 25 μm or more.

These results clearly demonstrate the effectiveness of the method of the present invention.

What is claimed is:

1. A method of forming a carbon layer by vapor phase deposition, comprising the steps of:

adjusting a content of particles having a particle size of 0.5 μm or more in a film deposition system of the carbon layer to 1000 particles/ft$^3$/min or less; and then starting a film deposition process of the carbon layer;

wherein said carbon layer is formed as a protective coating on a thermal head performing thermal recording;

wherein the carbon layer is formed directly on top of a lower protective layer such that the thermal head has a protective coating, and wherein the carbon layer and the lower protective layer are successively formed on the thermal head under a continuous vacuum.

2. The method according to claim 1, wherein said content of the particles having the particle size of 0.5 μm or more is reduced to 500 particles/ft$^3$/min.

3. The method according to claim 1, wherein a lower limit of said content of the particles having the particle size of 0.5 μm or more ranges between 50 particles/ft$^3$/min and 100 particles/ft$^3$/min.

4. The method of forming a carbon layer by vapor phase deposition according to claim 1, wherein said carbon layer is formed on top of an intermediate layer and the intermediate layer is formed on top of a lower protective layer such that the thermal head has a protective coating of a three-layer structure.

5. The method of forming a carbon layer by vapor phase deposition according to claim 4, wherein said carbon layer has a thickness from 0.5 μm to 5 μm, said intermediate layer has a thickness from 0.05 μm to 1 μm, and said lower protective layer has a thickness from 0.2 μm to 20 μm.

6. The method according to claim 1, wherein said step of adjusting the content of particles includes cleaning an interior of a chamber of the film deposition system in which the film deposition process occurs using a dust cloth that produces no more than 3000 particles/cfm.

7. The method according to claim 1, wherein said step of adjusting the content of particles includes cleaning an interior of a chamber of the film deposition system in which the film deposition process occurs using a dust cloth that produces no more than 1000 particles/cfm.

8. The method according to claim 1, wherein said step of adjusting the content of particles includes cleaning an interior of a chamber of the film deposition system in which the film deposition process occurs using a dust cloth that produces no more than 300 particles/cfm.

9. The method according to claim 6, wherein said step of adjusting the content of particles further includes pumping out the chamber after cleaning to remove floating particles within the chamber.

10. A method of forming a carbon layer by vapor phase deposition, comprising the steps of:

adjusting a content of particles having a particle size of 0.5 $\mu$m or more in a film deposition system of the carbon layer to 1000 particles/ft$^3$/min or less; and then starting a film deposition process of the carbon layer;

wherein said carbon layer is formed as a protective coating on a thermal head performing thermal recording, wherein said carbon layer is formed on top of an intermediate layer and the intermediate layer is formed on top of a lower protective layer such that the thermal head has a protective coating of a three-layer structure, and wherein the carbon layer, the intermediate layer, and the lower protective layer are successively formed on the thermal head under a continuous vacuum.

11. The method according to claim 10, wherein said content of the particles having the particle size of 0.5 $\mu$m or more is reduced to 500 particles/ft$^3$/min.

12. The method according to claim 10, wherein a lower limit of said content of the particles having the particle size of 0.5 $\mu$m or more ranges between 50 particles/ft$^3$/min and 100 particles/ft$^3$/min.

13. The method according to claim 10, wherein said carbon layer has a thickness from 0.5 $\mu$m to 5 $\mu$m, said intermediate layer has a thickness from 0.05 $\mu$m to 1 $\mu$m, and said lower protective layer has a thickness from 0.2 $\mu$m to 20 $\mu$m.

14. The method according to claim 10, wherein said step of adjusting the content of particles includes cleaning an interior of a chamber of the film deposition system in which the film deposition process occurs using a dust cloth that produces no more than 3000 particles/cfm.

15. The method according to claim 10, wherein said step of adjusting the content of particles includes cleaning an interior of a chamber of the film deposition system in which the film deposition process occurs using a dust cloth that produces no more than 1000 particles/cfm.

16. The method according to claim 10, wherein said step of adjusting the content of particles includes cleaning an interior of a chamber of the film deposition system in which the film deposition process occurs using a dust cloth that produces no more than 300 particles/cfm.

17. The method according to claim 14, wherein said step of adjusting the content of particles further includes pumping out the chamber after cleaning to remove floating particles within the chamber.

* * * * *